(12) United States Patent
Yang

(10) Patent No.: US 9,030,891 B2
(45) Date of Patent: May 12, 2015

(54) CHARGE PUMP CIRCUIT AND MEMORY

(71) Applicant: Shanghai Huahong Grace Semiconductor Manufacturing Corporation, Shanghai (CN)

(72) Inventor: Guangjun Yang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/143,033

(22) Filed: Dec. 30, 2013

(65) Prior Publication Data

US 2014/0211575 A1 Jul. 31, 2014

(30) Foreign Application Priority Data

Jan. 25, 2013 (CN) .......................... 2013 1 0029800

(51) Int. Cl.
*G11C 7/00* (2006.01)
*G11C 5/14* (2006.01)
(52) U.S. Cl.
CPC ...................................... *G11C 5/145* (2013.01)
(58) Field of Classification Search
CPC .................................... G11C 8/08; G11C 5/14
USPC ............................................ 365/189.11, 226
See application file for complete search history.

(56) References Cited

U.S. PATENT DOCUMENTS

| 7,893,753 | B2* | 2/2011 | Kimura | 327/537 |
| 8,130,026 | B2* | 3/2012 | Maejima | 327/534 |
| 8,362,823 | B2* | 1/2013 | Lin et al. | 327/536 |
| 8,482,341 | B2* | 7/2013 | Kimura | 327/537 |
| 8,593,840 | B2* | 11/2013 | Shionoiri et al. | 363/60 |
| 8,612,779 | B2* | 12/2013 | More et al. | 713/300 |
| 8,654,589 | B2* | 2/2014 | Yu et al. | 365/185.21 |

FOREIGN PATENT DOCUMENTS

CN 1485971 A 3/2004

* cited by examiner

*Primary Examiner* — Michael Tran
(74) *Attorney, Agent, or Firm* — Harness, Dickey & Pierce, P.L.C.

(57) ABSTRACT

Charge pump circuit and memory are provided. The charge pump circuit includes a clock driving unit, a voltage boosting unit, a boosting swing control unit, a first and second NMOS tubes, a first and second current mirror units. The clock driving unit is adapted to form and output clock driving signals to the voltage boosting unit. The voltage boosting unit is adapted to boost voltage and output it to the boosting swing control unit and the first current minor unit. The boosting swing control unit is adapted to output boosting swing control signals to the first NMOS tube. The first current minor unit is to output first mirror current and the second current minor unit is to minor the first mirror current and output second minor current. Frequency of the clock driving signal varies with leakage current load, and size of the charge pump circuit and power consumption are reduced.

10 Claims, 3 Drawing Sheets

CHARGE PUMP CIRCUIT AND MEMORY

CROSS-REFERENCE TO RELATED APPLICATIONS

The present application claims priority to Chinese patent application No. 201310029800.1, filed on Jan. 25, 2013, and entitled "CHARGE PUMP CIRCUIT AND MEMORY", and the entire disclosure of which is incorporated herein by reference.

FIELD OF THE DISCLOSURE

The present disclosure generally relates to circuit design technology, and more particularly, to a charge pump circuit and a memory.

BACKGROUND OF THE DISCLOSURE

With the development of semiconductor technology, semiconductor products are developed to have low power consumption and low cost, thus, a power-supply voltage of a memory is relatively low, such as 2.5V and 1.8V. However, to realize reading and writing of stored information, a voltage for programming and erasing, which is much higher than the power-supply voltage, is required, such as 8V and 11V. Therefore, charge pump circuits, which are used to generate a high voltage for programming and erasing from a low power-supply voltage, are widely used in memories.

FIG. 1 schematically illustrates a structural diagram of a two-stage Dickson charge pump. Referring to FIG. 1, each voltage boosting stage in the two-stage Dickson charge pump includes an N-type Metal-Oxide-Semiconductor (NMOS) tube with a connection mode in a diode (i.e., a gate electrode is connected with a drain electrode) and a capacitor which has its one end connected to a source electrode of the NMOS tube and another end connected to a clock oscillator circuit. Capacitors in the two voltage boosting stages are coupling capacitors with a same capacitance. The two clock oscillator circuits generate two-phase nonoverlapping clock signals $\phi$ and $\bar{\phi}$. The amplitudes of the two-phase nonoverlapping clock signals are generally equal to a power-supply voltage VDD. During operation of the charge pump, when $\phi$ is of a low level, the power supply VDD charges C1 through the NMOS tube; when $\phi$ is of a high level, an upper plate voltage of C1 changes to 2*VDD and C2 is charged. As such, charges are transmitted from a left side to a right side. When $\phi$ turns to a low level again, since the NMOS tube only allows charges to flow in one direction, the charges cannot be transmitted from the right side to the left side. Therefore, with an increased number of stages of the charge pump, charges are transmitted from the power supply to an output terminal, so that a desired high voltage is obtained.

FIG. 2 schematically illustrates a structural diagram of a charge pump circuit provided in a memory. Referring to FIG. 2, an erasing operation on a memory array is taken as an example. When an erasing operation needs to be performed on a memory unit in the memory array 16, a high output voltage VEP of the charge pump circuit is provided to a decoding circuit 15 through an erasing control unit 14 as a bias voltage. The decoding circuit 15 is adapted to provide an erasing voltage to the memory array 16. The charge pump circuit includes: a clock driving unit 11, a voltage boosting unit 12, a boosting swing control unit 13 and an adjusting transistor MN1. The clock driving unit 11 is adapted to output a clock driving signal CLK having a fixed frequency. Driven by the clock driving signal CLK, the voltage boosting unit 12 outputs a boosted voltage HVE. The voltage boosting unit 12 may have the same structure as the two-stage Dickson charge pump shown in FIG. 1. The clock driving signal CLK is the two-phase nonoverlapping clock signals $\phi$ and $\bar{\phi}$ and the boosted voltage HVE is the high voltage Vout in FIG. 1. The boosting swing control unit 13 is adapted to output a boosting swing control signal GRAMP according to the boosted voltage HVE to control a gate electrode of the adjusting transistor MN1, so as to limit a boosting rate of the high output voltage VEP of a source electrode of the adjusting transistor MN1 and avoid a reliability problem on a gate oxide layer of the memory unit which may be caused by excessively rapid boosting of the high output voltage VEP. To reduce a voltage loss, the adjusting transistor MN1 is generally a zero-threshold NMOS tube, which has a very low voltage threshold close to zero and is called native NMOS.

FIG. 3 schematically illustrates waveforms of output signals of various units in the charge pump circuit shown in FIG. 2. After the charge pump circuit is started, the clock driving unit 11 begins to output the clock driving signal CLK having the fixed frequency. Driven by the clock driving signal CLK, the boosted voltage HVE output by the voltage boosting unit 12 becomes stable after a time period. Under the control of the boosting swing control signal GRAMP output by the boosting swing control unit 13, a boosting rate of the high output voltage VEP of the charge pump circuit slows down gradually.

In a low power consumption system, a peak current denotes to a current flowing in a system in one micro second. Generally, the peak current cannot be higher than 1 mA in the system. In conventional technologies, referring to FIG. 1 and FIG. 2, to control the peak current in a required range, the clock driving signal CLK output by the clock driving unit 11 has a low frequency. When the memory unit is programmed or erased, the decoding circuit 15 and the memory array 16 have leakage currents therein. The sum of the leakage currents is a leakage current load which provides the voltage for programming or erasing in the charge pump circuit. When the frequency of the clock driving signal CLK output by the clock driving unit 11 gradually lows down, to satisfy a requirement on the leakage current load and keep a charge transfer amount among stages of the charge pump circuit unchanged, a capacitor with great capacitance is required in each stage of charge pump circuit to store a large amount of charges. However, the capacitor with great capacitance may increase a size of the charge pump circuit, which does not satisfy a high-level integration of a circuit. Therefore, a charge pump circuit with a small size and low power consumption is desired.

More information about a charge pump circuit with low power consumption can be found in a Chinese patent application No. 03156438.0 and entitled "charge pump circuit with high precision and low power consumption".

SUMMARY

In embodiments of the present disclosure, a charge pump circuit with a small size and low power consumption is provided.

In one embodiment of the present disclosure, a charge pump circuit may be provided, including a clock driving unit, a voltage boosting unit, a boosting swing control unit, a first NMOS tube, a first current minor unit, a second NMOS tube and a second current mirror unit. The clock driving unit is adapted to form a clock driving signal based on a second mirror current output by the second current minor unit and output the clock driving signal to the voltage boosting unit. The voltage boosting unit is adapted to boost a voltage based on the clock driving signal and output a boosted voltage to the boosting swing control unit and the first current mirror unit. The boosting swing control unit is adapted to output a boosting swing control signal to a gate electrode of the first NMOS tube based on the boosted voltage. The first current mirror unit includes a first P-type Metal-Oxide-Semiconductor (PMOS) tube and a second PMOS tube, where gate electrodes of the first and second PMOS tubes are connected, source electrodes of the first and second PMOS tubes are connected and input with the boosted voltage. A drain electrode and the gate electrode of the first PMOS tube are connected with a drain electrode of the first NMOS tube, and a source electrode of the first NMOS tube is an output terminal of the charge pump circuit. A drain electrode of the second PMOS tube outputs the first minor current. A gate electrode of the second NMOS tube is input with a first voltage and a drain electrode thereof is connected with the drain electrode of the second PMOS tube. The second current mirror unit includes a third NMOS tube and a fourth NMOS tube, where gate electrodes of the third and fourth NMOS tubes are connected, source electrodes of the third and fourth NMOS tubes are input with a second voltage, a drain electrode and the gate electrode of the third NMOS tube are connected with the source electrode of the second NMOS tube, and a drain electrode of the fourth NMOS tube outputs the second mirror current. The second voltage is lower than the first voltage.

Optionally, a channel of the first PMOS tube has a width-to-length ratio greater than that of the second PMOS tube.

Optionally, a channel of the fourth PMOS tube has a width-to-length ratio greater than that of the third PMOS tube.

Optionally, the first voltage may be supplied by a power supply, and the second voltage is a ground connection.

Optionally, the first NMOS tube may be a zero-threshold NMOS tube.

Accordingly, in one embodiment, a memory is provided, including an erasing control unit, a decoding circuit, a memory array and a charge pump circuit provided in the present disclosure.

Compared with the conventional solutions, the present disclosure may have following advantages. In the charge pump circuit provided in the present disclosure, a leakage current load is detected to control a clock driving signal output by a clock driving unit, so that the frequency of the clock driving signal varies with the leakage current load automatically. During a beginning time period after the charge pump circuit starts to work, since the detected leakage current load is relatively low, the clock driving signal output by the clock driving unit may have a low frequency. With the gradually increased detected leakage current load, the clock driving signal may have a gradually increased frequency correspondingly.

During the beginning time period after the charge pump circuit starts to work, an output voltage of the charge pump circuit rises rapidly. And due to a low frequency of the clock driving signal, a peak current is reduced and further power consumption of the charge pump circuit is reduced. When the leakage current load rises, the frequency of the clock driving signal rises, so that a required leakage current load can be met without increasing a size of the charge pump circuit. Besides, a driving ability of the charge pump circuit may be limited because of the rise in the leakage current load, thus, the leak current is low and the power consumption will not be increased although the frequency of the clock driving signal rises.

DETAILED DESCRIPTION OF THE DISCLOSURE

As described in background, in conventional charge pump circuits, to satisfy a requirement on a leak current and reduce power consumption, a frequency of a clock driving signal output by a clock driving unit is reduced. When a charge pump circuit is applied in a memory to provide a voltage for programming or erasing for the memory, leakage currents in a memory array and a decoding circuit constitute a leakage current load of the charge pump circuit. To satisfy a requirement on the leakage current load and keep a charge transfer amount among stages of the charge pump circuit unchanged, a capacitor with great capacitance is required in each stage of charge pump circuit to store a large amount of charges. However, the capacitor with great capacitance may increase a size of the charge pump circuit, which does not satisfy a high-level integration of a circuit. Therefore, a charge pump circuit with a small size and low power consumption is provided in the present disclosure.

In order to clarify the objects, characteristics and advantages of the disclosure, embodiments of present disclosure will be described in detail in conjunction with accompanying drawings.

Many details are described in following description to better understand the present disclosure. It should be noted that, the following embodiments are only illustrative. Those skilled in the art can modify and vary the embodiments without departing from the spirit and scope of the present disclosure.

Charge pump circuits are widely used in memories to provide a required high voltage for erasing or programming for the memories. Hereinafter, a charge pump circuit is described in detail, where an erasing operation is performed on a memory.

Figure 4:
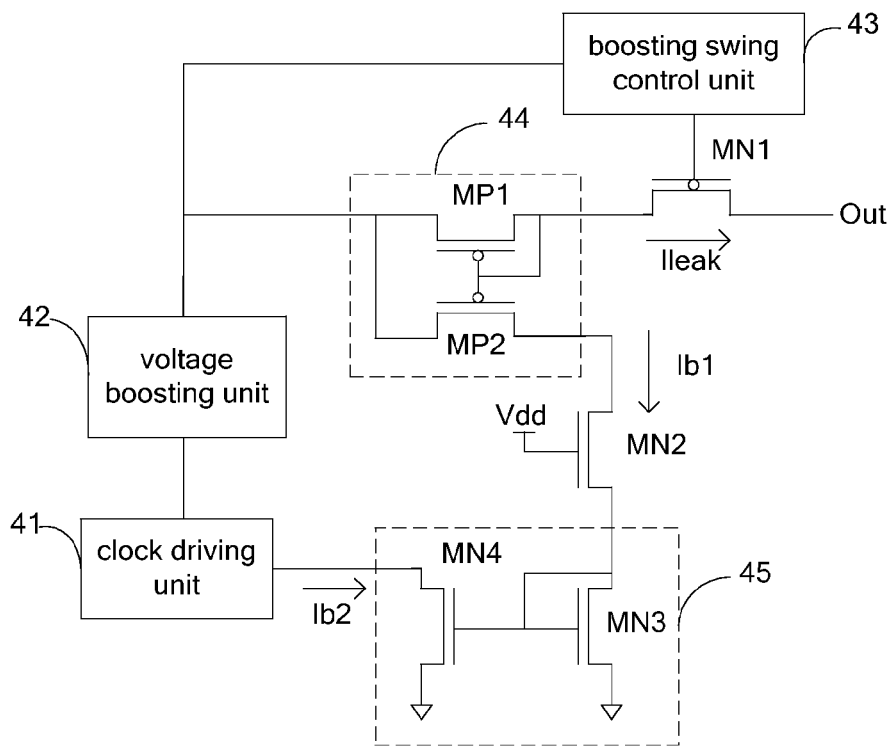
FIG. 4 schematically illustrates a structural diagram of a charge pump circuit according to one embodiment of the present disclosure.

FIG. 4 schematically illustrates a structural diagram of a charge pump circuit according to one embodiment of the present disclosure. Referring to FIG. 4, the charge pump circuit includes a clock driving unit 41, a voltage boosting unit 42, a boosting swing control unit 43, a first NMOS tube MN1, a first current mirror unit 44, a second NMOS tube MN2 and a second current mirror unit 45.

Figure 1:
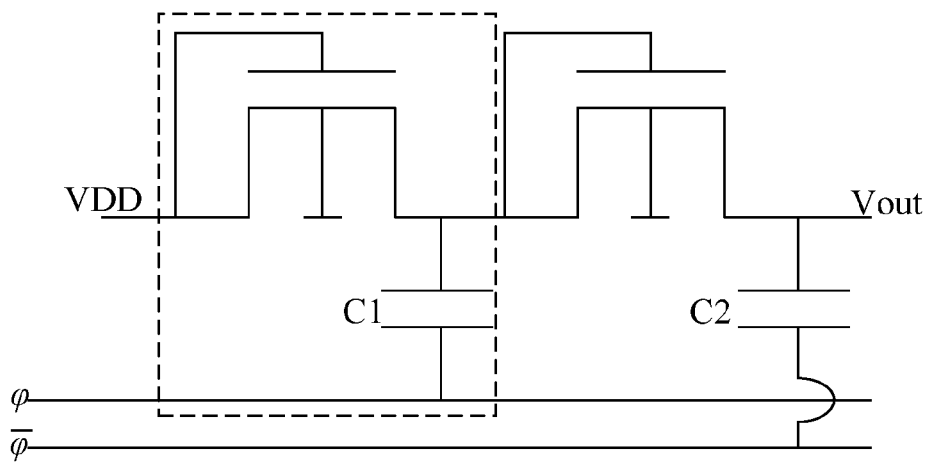
FIG. 1 schematically illustrates a structural diagram of a Dickson charge pump.
Figure 2:
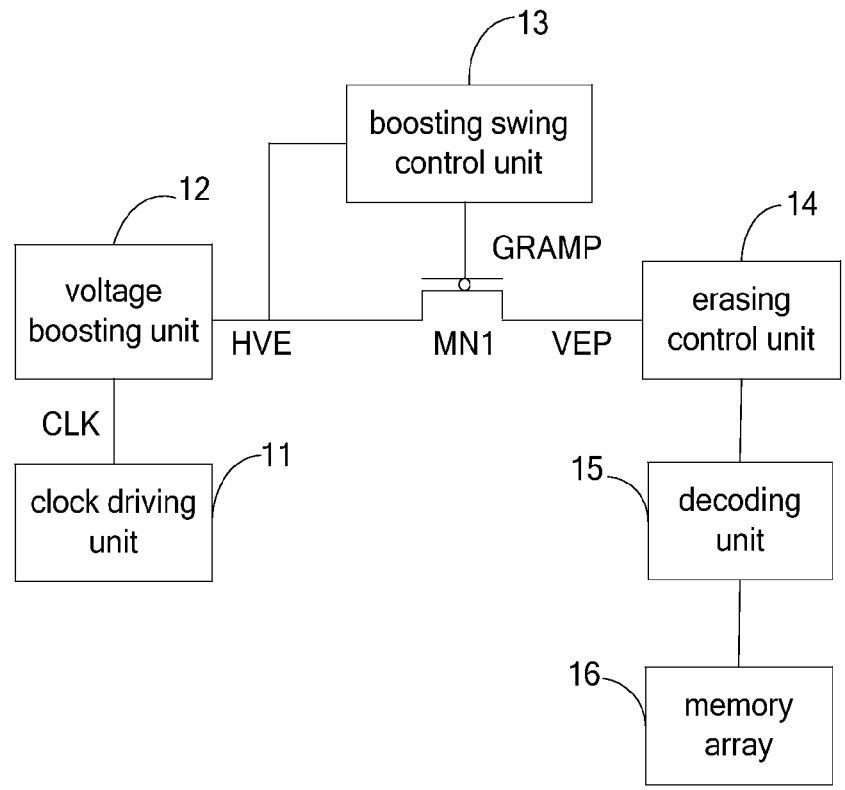
FIG. 2 schematically illustrates a structural diagram of a charge pump circuit provided in a memory.
Figure 3:
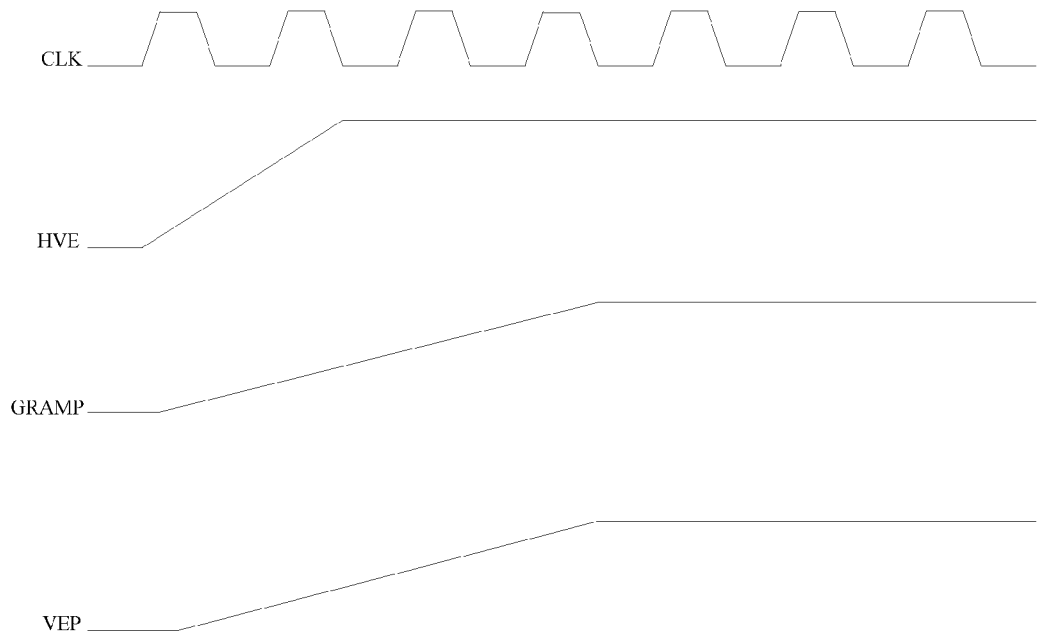
FIG. 3 schematically illustrates waveforms of output signals of various units in the charge pump circuit shown in FIG. 2.
Figure 5:
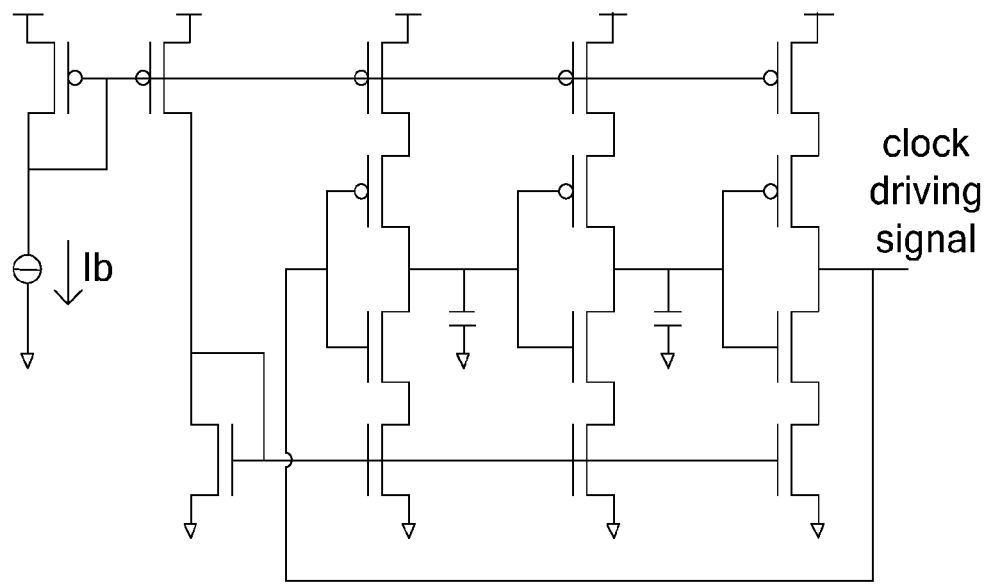
FIG. 5 schematically illustrates a circuit structure of a clock driving unit according to one embodiment of the present disclosure.

The clock driving unit 41 is adapted to form a clock driving signal based on a second mirror current Ib2 output by the second current minor unit 45 and output the clock driving signal to the voltage boosting unit 42. In some embodiments, the clock driving unit 41 may be a clock generator and a detailed circuit structure thereof may be a circuit shown in FIG. 5. Referring to FIG. 5, a frequency of the clock driving signal is positively correlated to a bias current Ib of the clock driving unit 41. That is, when the bias current Ib of the clock driving unit 41 rises, the frequency of the clock driving signal rises; and when the bias current Ib of the clock driving unit 41 decreases, the frequency of the clock driving signal decreases. It should be noted that, the circuit structure shown in FIG. 5 is only one embodiment of the present disclosure and the clock driving unit 41 may be other circuit structures in other embodiments, The voltage boosting unit 42 is adapted to boost a voltage based on the clock driving signal and output a boosted voltage to the boosting swing control unit 43 and the first current minor unit 44. The voltage boosting unit 42 is adapted to boost the voltage based on that a difference between voltages of two ends of a capacitor cannot change instantaneously. Detailed structures of the voltage boosting unit 42 may be the Dickson charge pump circuit shown in FIG. 1.

The boosting swing control unit 43 is adapted to output a boosting swing control signal to a gate electrode of the first NMOS tube MN1 based on the boosted voltage. When a memory unit in a memory array needs to be erased, a high voltage output by the charge pump circuit is input to a decoding circuit through an erasing control unit in a memory, so as to provide a bias voltage for the decoding circuit. The decoding circuit is adapted to provide an erasing voltage for the memory array. To avoid a reliability problem on a gate oxide layer of the memory unit caused by excessively rapid boosting of the bias voltage, a boosting rate of the high voltage output by the charge pump circuit needs to be controlled. Therefore, the first NMOS tube MN1 is controlled by the boosting swing control signal to limit the boosting rate of the high voltage output by the charge pump circuit.

The first current mirror unit 44 includes a first PMOS tube MP1 and a second PMOS tube MP2, where gate electrodes of the first and second PMOS tubes are connected, source electrodes of the first and second PMOS tubes are connected, and the boosted voltage is input into the source electrodes thereof. A drain electrode and the gate electrode of the first PMOS tube MP1 are connected with a drain electrode of the first NMOS tube MN1, and a drain electrode of the second PMOS tube MP2 outputs a first minor current Ib1. The first PMOS tube MP1 is an input transistor of the first current minor unit 44 and the second PMOS tube MP2 is an output transistor of the first current mirror unit 44. Therefore, a current Ileak flowing over the first PMOS tube MP1 is an input current of the first current minor unit 44, and the current Ib1 flowing over the second PMOS tube MP2 is an output current of the first current mirror unit 44. The input current Ileak of the first current mirror unit 44 is a leakage current load of the charge pump circuit, and generated by the decoding circuit and the memory array during an erasing operation on the memory.

In some embodiments, a channel of the first PMOS tube MP1 has a width-to-length ratio greater than that of the second PMOS tube MP2. Therefore, the first minor current Ib1 is lower than the leakage current load Ileak, which effectively reduces power consumption of the first current minor unit 44.

A source electrode of the first NMOS tube MN1 is an output terminal Out of the charge pump circuit. To reduce a voltage loss, the first NMOS tube MN1 is generally a zero-threshold NMOS tube, which has a very low voltage threshold close to zero and is called native NMOS. A gate electrode of the second NMOS tube MN2 is input with a first voltage Vdd and a drain electrode thereof is connected with the drain electrode of the second PMOS tube MP2. In some embodiments, the first voltage Vdd may be supplied by a power supply and may be 3.3V, 1.8V, 1.5V or 1.2V.

The second current mirror unit 45 includes a third NMOS tube MN3 and a fourth NMOS tube MN4, where gate electrodes of the third and fourth NMOS tubes are connected, source electrodes of the third and fourth NMOS tubes are input with a second voltage, a drain electrode and the gate electrode of the third NMOS tube MN3 are connected with the source electrode of the second NMOS tube MN2, and a drain electrode of the fourth NMOS tube MN4 outputs the second minor current Ib2. The second voltage is lower than the first voltage Vdd. In some embodiments, the second voltage is a ground connection. The third NMOS tube MN3 is an input transistor of the second current minor unit 45 and the fourth NMOS tube MN4 is an output transistor of the second current minor unit 45. Therefore, a current Ib2 flowing over the fourth NMOS tube MN4 is an output current of the second current minor unit 45. The second mirror current Ib2 has a direction shown in FIG. 4. In some embodiments, a channel of the third NMOS tube MN3 has a width-to-length ratio smaller than that of the fourth NMOS tube MN4. Therefore, the second mirror current Ib2 is higher than the first minor current Ib1. The second mirror current Ib2, as a portion of the bias current Ib of the clock driving unit 41, may change the frequency of the clock driving signal by changing the bias current Ib.

The second NMOS tube MN2 is adapted to clamp an electrical level to prevent a drain electrode voltage of the second PMOS tube MP2 from being reduced by the third NMOS tube MN3, that is, to prevent the first current minor unit 44 from losing efficacy.

In the charge pump circuit provided in embodiments of the present disclosure, two current minor units (the first current mirror unit 44 and the second current minor unit 45) are used to perform minoring to the leakage current load Beak of the charge pump circuit. The obtained second minor current Ib2, as a portion of the bias current Ib of the clock driving unit 41, changes the frequency of the clock driving signal by changing the bias current Ib, so that the frequency of the clock driving signal automatically varies with the leakage current load Ileak.

Figure 6:
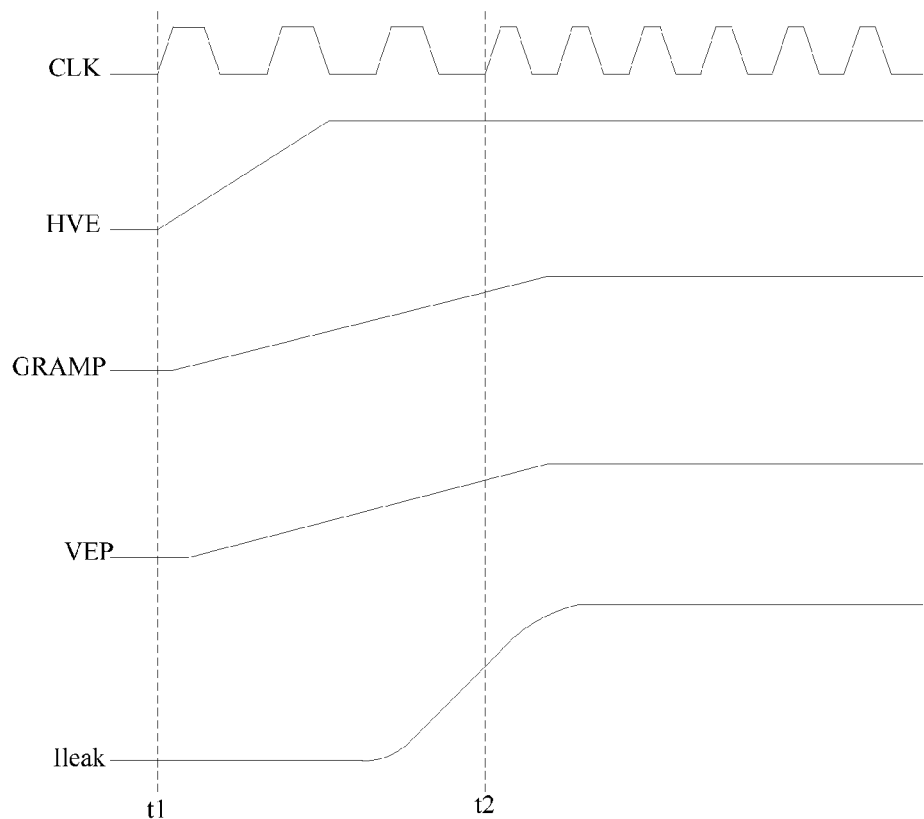
FIG. 6 schematically illustrates waveforms of output signals of various units in a charge pump circuit according to one embodiment of the present disclosure.

FIG. 6 schematically illustrates waveforms of output signals of various units in a charge pump circuit according to one embodiment of the present disclosure. CLK stands for a clock driving signal output by a clock driving unit 41, HVE stands for a boosted voltage output by a voltage boosting unit 42, GRAMP stands for a boosting swing control signal output by a boosting swing control unit 43, VEP stands for a voltage output by the output terminal Out of the charge pump circuit, and Beak stands for a leakage current load. To better understand embodiments of the present disclosure, working principles of the charge pump circuit are described in detail in conjunction with the accompany drawings.

Referring to FIG. 6, assuming the charge pump circuit is started to operation at a time point t1, since no leakage current is generated in a decoding circuit and a memory array in a memory, that is, the leakage current is zero, a bias current Ib of the clock driving unit 41 and a frequency of the clock driving signal CLK output by the clock driving unit 41 are relatively low. Driven by the clock driving signal CLK, the boosted voltage HVE output by the voltage boosting unit 42 rises in slope. The boosting swing control unit 43 is adapted to adjust the boosted voltage HVE and output the boosting swing control signal GRAMP. Under the control of the boosting swing control signal GRAMP, a first NMOS tube adjusts the boosted voltage HVE and output the high voltage VEP. The high voltage VEP output from the charge pump circuit provides a bias voltage for the decoding circuit through an erasing control unit in the memory.

During a beginning time period after the charge pump circuit is started, since the bias voltage is low, the leakage current load Ileak is low and the clock driving signal CLK remains a low frequency. When it comes to a time point t2, with a rise in the voltage VEP output from the charge pump circuit, after the leakage current load Ileak is mirrored by a first current minor unit 44 and a second current mirror unit 45, the obtained second mirror current Ib2 serves as a portion of the bias current Ib in the clock current unit 41. The rise in the bias current Ib results in a rise in a frequency of the clock driving signal CLK output by the clock driving unit 41.

During a time period from t1 to t2, the voltage VEP output from the charge pump circuit rises rapidly. And due to a low frequency of the clock driving signal CLK, a peak current is reduced and further power consumption of the charge pump circuit is reduced. When it comes to the time point t2, the leakage current load Ileak becomes high and the frequency of the clock driving signal CLK rises, so that a required leakage current load Ileak can be met without increasing a size of the charge pump circuit. Besides, a driving ability of the charge pump circuit may be limited because of the rise in the leakage current load Beak, thus, the leak current is low and the power consumption will not be increased although the frequency of the clock driving signal CLK rises.

In one embodiment, a memory is provided, including an erasing control unit, a decoding circuit, a memory array and a charge pump circuit provided in embodiments of the present disclosure. The charge pump circuit may have a circuit structure illustrated in FIG. 4.

To sum up, two current minor units are used to perform mirroring to a leakage current load of a charge pump circuit. A current obtained by mirroring is used to control a clock driving unit which generates a clock driving signal, so that a frequency of the clock driving signal automatically varies with the leakage current load, which reduces a size of the charge pump circuit and power consumption.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A charge pump circuit, comprising a clock driving unit, a voltage boosting unit, a boosting swing control unit, a first NMOS (N-type Metal-Oxide-Semiconductor) tube, a first current minor unit, a second NMOS tube and a second current mirror unit;

wherein the clock driving unit is adapted to form a clock driving signal based on a second mirror current output by the second current minor unit and output the clock driving signal to the voltage boosting unit;

the voltage boosting unit is adapted to boost a voltage based on the clock driving signal and output a boosted voltage to the boosting swing control unit and the first current minor unit;

the boosting swing control unit is adapted to output a boosting swing control signal to a gate electrode of the first NMOS tube based on the boosted voltage;

the first current mirror unit comprises a first PMOS tube and a second PMOS (P-type Metal-Oxide-Semiconductor) tube, where gate electrodes of the first and second PMOS tubes are connected, source electrodes of the first and second PMOS tubes are connected and input with the boosted voltage, a drain electrode and the gate electrode of the first PMOS tube are connected with a drain electrode of the first NMOS tube, and a drain electrode of the second PMOS tube outputs the first minor current;

a source electrode of the first NMOS tube is an output terminal of the charge pump circuit, a gate electrode of the second NMOS tube is input with a first voltage and a drain electrode thereof is connected with the drain electrode of the second PMOS tube; and the second current mirror unit comprises a third NMOS tube and a fourth NMOS tube, where gate electrodes of the third and fourth NMOS tubes are connected, source electrodes of the third and fourth NMOS tubes are input with a second voltage, a drain electrode and the gate electrode of the third NMOS tube are connected with the source electrode of the second NMOS tube, and a drain electrode of the fourth NMOS tube outputs the second minor current, and the second voltage is lower than the first voltage.

2. The charge pump circuit according to claim 1, wherein a channel of the first PMOS tube has a width-to-length ratio greater than that of the second PMOS tube.

3. The charge pump circuit according to claim 1, wherein a channel of the fourth PMOS tube has a width-to-length ratio greater than that of the third PMOS tube.

4. The charge pump circuit according to claim 1, wherein the first voltage is supplied by a power supply and the second voltage is a ground connection.

5. The charge pump circuit according to claim 1, wherein the first NMOS tube is a zero-threshold NMOS tube.

6. A memory, comprising an erasing control unit, a decoding circuit, a memory array and a charge pump circuit which comprises a clock driving unit, a voltage boosting unit, a boosting swing control unit, a first NMOS tube, a first current mirror unit, a second NMOS tube and a second current mirror unit;

wherein the clock driving unit is adapted to form a clock driving signal based on a second mirror current output by the second current minor unit and output the clock driving signal to the voltage boosting unit;

the voltage boosting unit is adapted to boost a voltage based on the clock driving signal and output a boosted voltage to the boosting swing control unit and the first current minor unit;

the boosting swing control unit is adapted to output a boosting swing control signal to a gate electrode of the first NMOS tube based on the boosted voltage;

the first current mirror unit comprises a first PMOS tube and a second PMOS tube, where gate electrodes of the first and second PMOS tubes are connected, source electrodes of the first and second PMOS tubes are connected and input with the boosted voltage, a drain electrode and the gate electrode of the first PMOS tube are connected with a drain electrode of the first NMOS tube, and a drain electrode of the second PMOS tube outputs the first mirror current;

a source electrode of the first NMOS tube is an output terminal of the charge pump circuit, a gate electrode of the second NMOS tube is input with a first voltage and a drain electrode thereof is connected with the drain electrode of the second PMOS tube; and the second current mirror unit comprises a third NMOS tube and a fourth NMOS tube, where gate electrodes of the third and fourth NMOS tubes are connected, source electrodes of the third and fourth NMOS tubes are input with a second voltage, a drain electrode and the gate electrode of the third NMOS tube are connected with the source electrode of the second NMOS tube, and a drain electrode of the fourth NMOS tube outputs the second minor current, and the second voltage is lower than the first voltage.

7. The memory according to claim 6, wherein a channel of the first PMOS tube has a width-to-length ratio greater than that of the second PMOS tube.

8. The memory according to claim 6, wherein a channel of the fourth PMOS tube has a width-to-length ratio greater than that of the third PMOS tube.

9. The memory according to claim 6, wherein the first voltage is supplied by a power supply and the second voltage is a ground connection.

10. The memory according to claim 6, wherein the first NMOS tube is a zero-threshold NMOS tube.

* * * * *